United States Patent
Wu et al.

(10) Patent No.: US 7,491,615 B2
(45) Date of Patent: Feb. 17, 2009

(54) METHOD OF FABRICATING STRAINED-SILICON TRANSISTORS AND STRAINED-SILICON CMOS TRANSISTORS

(75) Inventors: Chih-Ning Wu, Hsin-Chu (TW); Hsin Tai, Taipei (TW); Chung-Ju Lee, Hsin-Chu Hsien (TW); Wei-Tsun Shiau, Kao-Hsiung Hsien (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 544 days.

(21) Appl. No.: 11/162,798

(22) Filed: Sep. 23, 2005

(65) Prior Publication Data

US 2007/0072353 A1 Mar. 29, 2007

(51) Int. Cl.
*H01L 21/336* (2006.01)
(52) U.S. Cl. ............... 438/300; 438/197; 257/E21.633
(58) Field of Classification Search ........... 438/197, 438/300; 257/E21.633
See application file for complete search history.

(56) References Cited

U.S. PATENT DOCUMENTS

| 6,406,973 | B1 * | 6/2002 | Lee | 438/416 |
|---|---|---|---|---|
| 7,022,610 | B2 * | 4/2006 | Chou et al. | 438/704 |
| 2005/0035409 | A1 | 2/2005 | Ko | |
| 2005/0269671 | A1 * | 12/2005 | Faure et al. | 257/618 |
| 2006/0105511 | A1 * | 5/2006 | Yang et al. | 438/197 |

FOREIGN PATENT DOCUMENTS

| CN | 1542545 A | 11/2004 |
|---|---|---|
| CN | 1607651 A | 4/2005 |
| TW | 448512 | 8/2001 |
| TW | I226657 | 1/2005 |

* cited by examiner

Primary Examiner—Bradley K Smith
(74) Attorney, Agent, or Firm—Winston Hsu

(57) ABSTRACT

A method of fabricating strained-silicon transistors includes providing a semiconductor substrate, in which the semiconductor substrate contains a gate structure thereon; performing an etching process to form two recesses corresponding to the gate structure within the semiconductor substrate; performing an oxygen flush on the semiconductor substrate; performing a cleaning process on the semiconductor substrate; and performing a selective epitaxial growth (SEG) to form an epitaxial layer in each recess for forming a source/drain region.

25 Claims, 10 Drawing Sheets

METHOD OF FABRICATING STRAINED-SILICON TRANSISTORS AND STRAINED-SILICON CMOS TRANSISTORS

BACKGROUND OF THE INVENTION

1. Field of the Invention

The present invention relates to a method of fabricating semiconductor transistors, and more particularly, to a method of utilizing selective epitaxial growth to fabricate strained-silicon transistors.

2. Description of the Prior Art

The selective epitaxial growth technology is widely applied in manufacturing numerous kinds of semiconductor devices, such as metal oxide semiconductor (MOS) transistors having raised source/drain regions and strained-silicon MOS transistors. The selective epitaxial growth technology is used to form an epitaxial layer on a single-crystalline substrate, in which the crystalline orientation of the epitaxial layer is almost identical to that of the substrate. Additionally, before the epitaxial layer is deposited on the substrate, a surface cleaning process must be performed to remove native oxides and other impurities from a surface of the substrate so that the epitaxial layer of a good quality can be obtained. Hence, the surface cleaning process plays an important role in the selective epitaxial growth technique.

Please refer to FIG. 1 through FIG. 3. FIG. 1 through FIG. 3 are perspective diagrams showing the means of fabricating strained-silicon transistors by utilizing a selective epitaxial growth according to the prior art. As shown in FIG. 1, a semiconductor substrate 10 is provided and a gate structure 12 is formed on the semiconductor substrate 10, in which the gate structure 12 includes a gate oxide layer 14, a gate 16 disposed on the gate oxide layer 14, a cap layer 18 disposed on the gate 16, and an oxide-nitride-oxide (ONO) offset spacer 20. Preferably, the gate oxide layer 14 is composed of silicon dioxide, the gate 16 is composed of doped polysilicon, and the cap layer 18 is composed of silicon nitride to protect the gate 16. Additionally, a shallow trench isolation (STI) 22 is formed around the active area of the gate structure 12 within the semiconductor substrate 10.

As shown in FIG. 2, an etching process, such as an anisotropic dry etching process is performed by utilizing the gate structure 12 as a mask to form two recesses 24 corresponding to the gate 16 in the semiconductor substrate 10, in which the depth of the recesses 24 is approximately 400 angstroms.

As shown in FIG. 3, after performing a wet cleaning step to the semiconductor substrate 10, a selective epitaxial growth (SEG) process is performed to form an epitaxial layer 26 composed of silicon germanium (SiGe) within the recesses 24, in which the epitaxial layer 26 will be served as the source/drain region of the strained-silicon MOS transistor.

When the recesses 24 are etched, impurities such as carbon, fluoride, and hydrogen atoms will remain on the surface of the recesses 24 and ultimately influence the formation of the epitaxial layer later in the fabrication process. Hence, a cleaning step is often performed after the formation of the recesses 24 to utilize a sulfuric acid-hydrogen peroxide mixture (SPM) to remove the remaining particles from the surface of the recesses 24. Nevertheless, the conventional SPM is not entirely effective in cleaning off the remaining atoms from the surface of the recesses thereby resulting in defects and influencing the process of the selective epitaxial growth afterwards.

SUMMARY OF THE INVENTION

It is therefore an objective of the present invention to provide a method of fabricating strained-silicon transistors to solve the above-mentioned problems.

According to the present invention, a method of fabricating strained-silicon transistors comprises providing a semiconductor substrate, wherein the semiconductor substrate comprises a gate structure thereon; performing an etching process to form two recesses corresponding to the gate structure within the semiconductor substrate; performing an oxygen flush on the semiconductor substrate; performing a cleaning process on the semiconductor substrate; and performing a selective epitaxial growth (SEG) to form an epitaxial layer in each recess for forming a source/drain region.

According to the present invention, a method of fabricating strained-silicon transistors comprises providing a semiconductor substrate, wherein the semiconductor substrate comprises a gate structure thereon; performing an etching process to form two recesses corresponding to the gate structure within the semiconductor substrate; utilizing a cleaning agent containing ozone to perform a cleaning process for removing the remaining etching particles from the surface of the semiconductor substrate; and performing a selective epitaxial growth (SEG) to form an epitaxial layer in each recess for forming a source/drain region.

According to the present invention, a method of fabricating strained-silicon CMOS transistors comprises providing a semiconductor substrate, wherein the semiconductor substrate comprises an NMOS region and a PMOS region, and the NMOS region and the PMOS region further comprise an NMOS gate and a PMOS gate separately; forming a sacrificial layer over the surface of the NMOS gate and the PMOS gate; performing a first etching process to etch part of the sacrificial layer for forming a spacer around the PMOS gate; performing a second etching process by utilizing the sacrificial layer, the PMOS gate and the spacer as a mask to form two recesses corresponding to the PMOS gate in the semiconductor substrate; performing an oxygen flush on the semiconductor substrate; performing a cleaning process on the semiconductor substrate; performing a selective epitaxial growth (SEG) to form an epitaxial layer in each recess for forming a source/drain region of the PMOS transistor; removing the sacrificial layer and the spacer; and forming a source/drain region of the NMOS transistor.

According to the present invention, a method of fabricating strained-silicon CMOS transistors comprises providing a semiconductor substrate, wherein the semiconductor substrate comprises an NMOS region and a PMOS region, and the NMOS region and the PMOS region further comprise an NMOS gate and a PMOS gate separately; forming a sacrificial layer over the surface of the NMOS gate and the PMOS gate; performing a first etching process to etch part of the sacrificial layer for forming a spacer around the PMOS gate; performing a second etching process by utilizing the sacrificial layer, the PMOS gate and the spacer as a mask to form two recesses corresponding to the PMOS gate in the semiconductor substrate; utilizing a cleaning agent containing ozone to perform a cleaning process on the semiconductor substrate for removing the remaining particles on the surface of the semiconductor substrate; performing a selective epitaxial growth (SEG) to form an epitaxial layer in each recess for forming a source/drain region of the PMOS transistor;

removing the sacrificial layer and the spacer; and forming a source/drain region of the NMOS transistor.

In contrast to the conventional method of fabricating MOS transistors, the present invention combines an in-situ oxygen flush after the formation of the predetermined source/drain region of the MOS transistor with a wet cleaning agent, or utilizes a cleaning agent containing ozone to remove the impurities or remaining atoms from the semiconductor substrate, and at the same time smoothens the surface of the recesses to ensure the yield of the selective epitaxial growth process afterwards.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
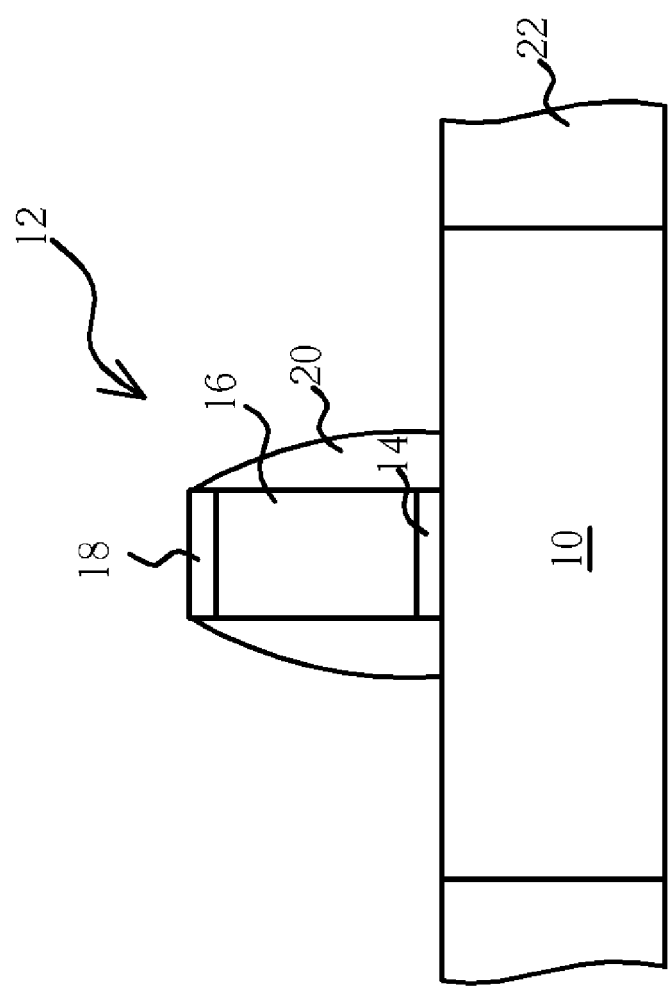
FIG. 1 through FIG. 3 are perspective diagrams showing the means of fabricating strained-silicon transistors by utilizing a selective epitaxial growth according to the prior art.
Figure 2:
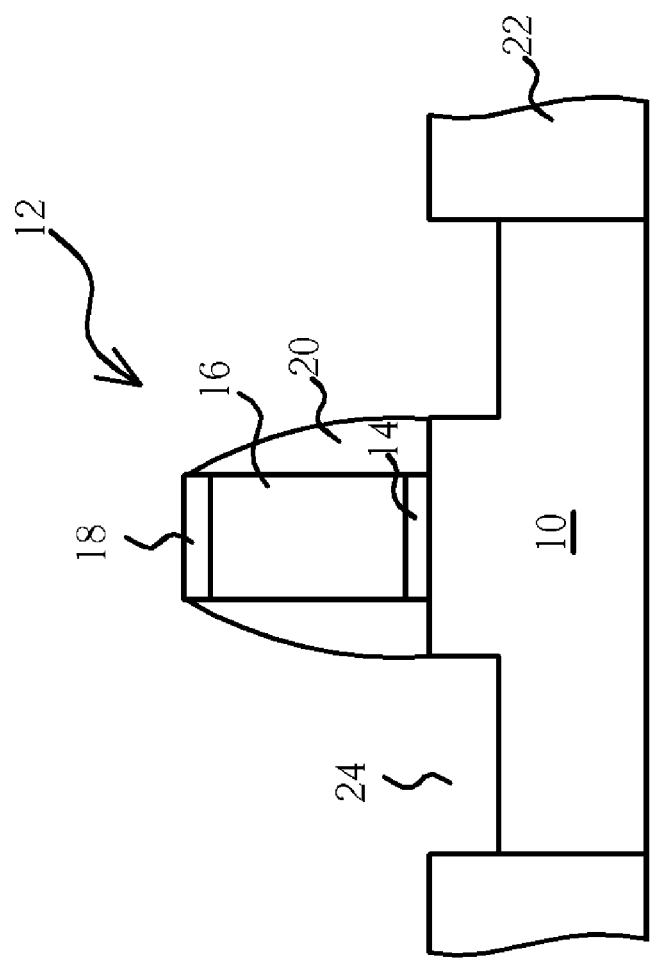
Figure 3:
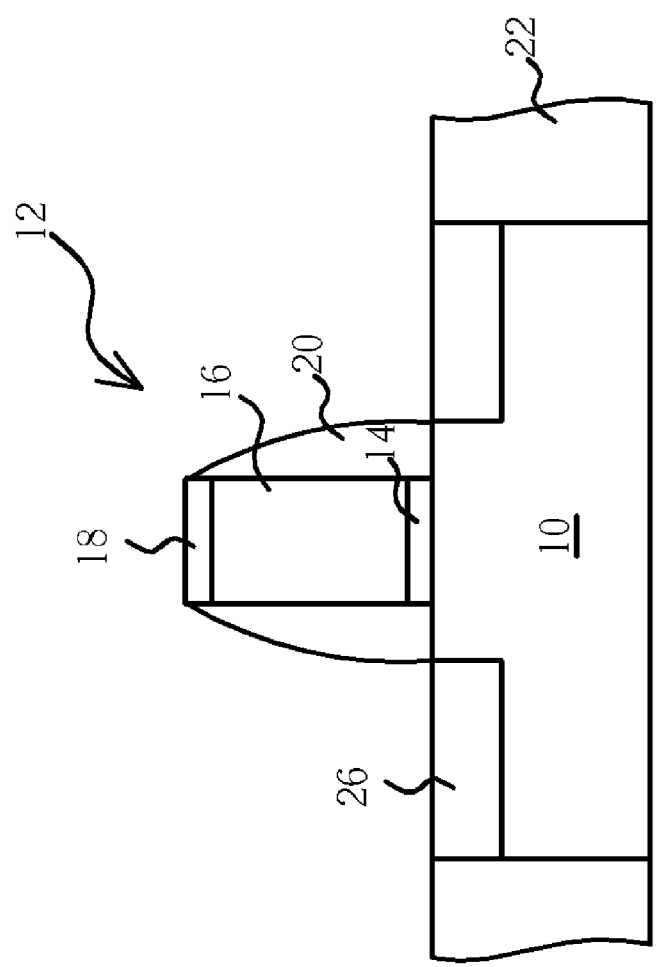
Figure 4:
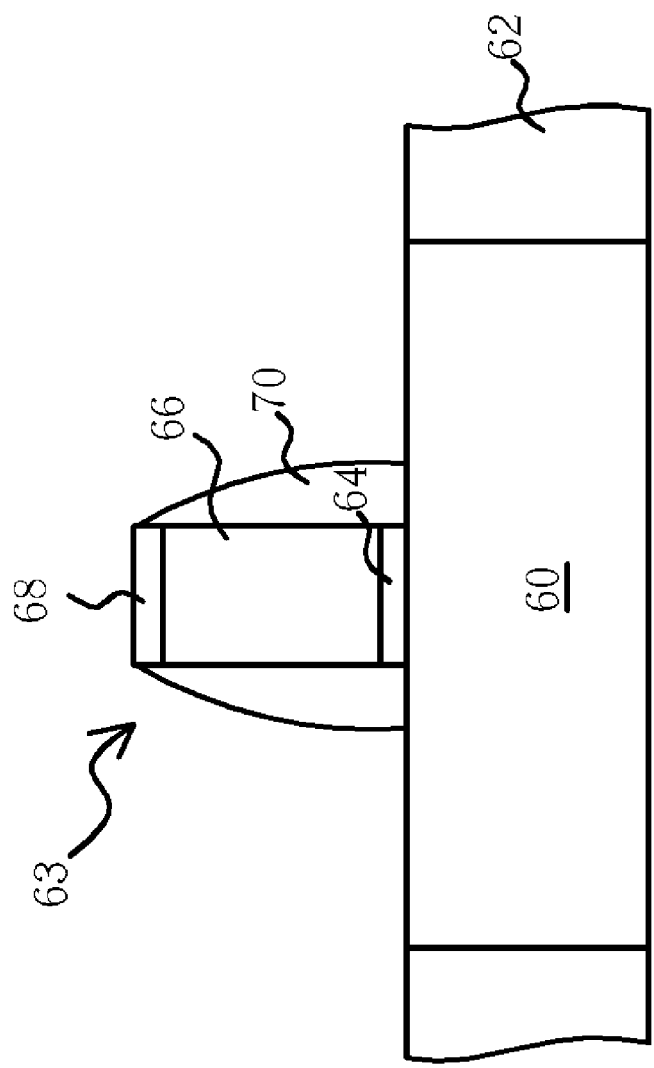
FIG. 4 through FIG. 6 are perspective diagrams showing the means of fabricating a strained-silicon PMOS transistor according to the present invention.
Figure 5:
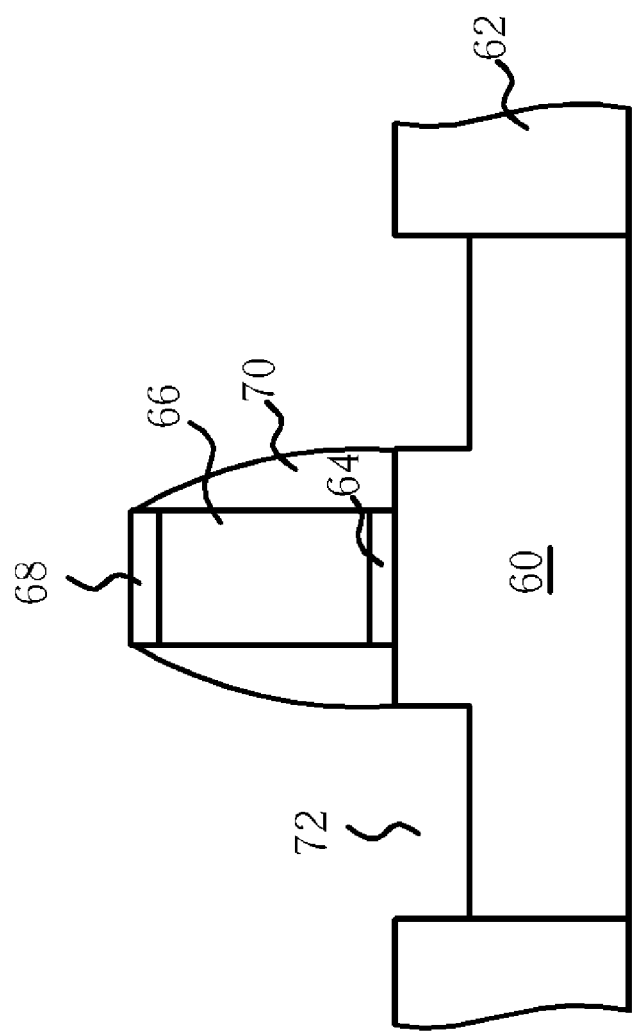
Figure 6:
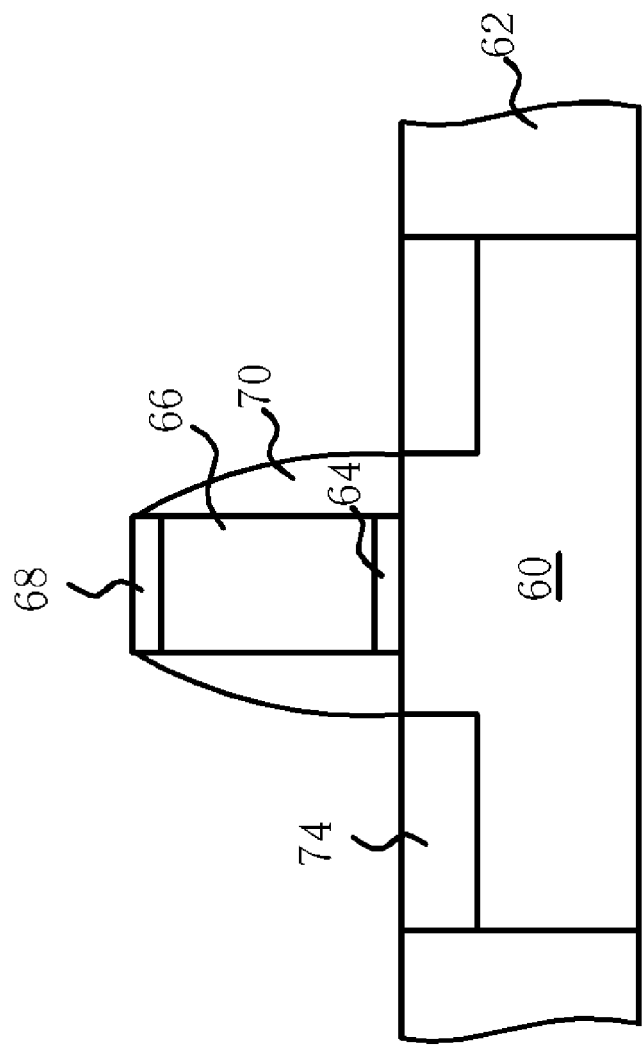

Please refer to FIG. 4 through FIG. 6. FIG. 4 through FIG. 6 are perspective diagrams showing the means of fabricating a strained-silicon PMOS transistor according to the present invention. As shown in FIG. 4, a semiconductor substrate 60, such as a silicon wafer or a silicon-on-insulator (SOI) substrate, is provided and a gate structure 63 is formed on the semiconductor substrate 60, in which the gate structure 63 includes a gate dielectric layer 64, a gate 66 disposed on the gate dielectric layer 64, a cap layer 68 formed on the gate 66, and an oxide-nitride-oxide (ONO) offset spacer 70. Preferably, the gate dielectric layer 64 is composed of silicon dioxide via oxidation or deposition processes and the cap layer 68 is composed of silicon nitride for protecting the gate 66 or polycide. Additionally, a shallow trench isolation (STI) 62 is formed around the active area of the gate structure 63 within the semiconductor substrate 60.

As shown in FIG. 5, an etching process, such as an anisotropic etching process is performed by utilizing the gate structure 63 as a mask to form two recesses 72 in the semiconductor substrate 60, in which the depth of the recesses 72 is approximately 400 angstroms. Next, an in-situ oxygen flush is performed to the semiconductor substrate 60 within the process chamber of the etching process. After the semiconductor substrate 60 is moved outside the process chamber, a cleaning process is performed by utilizing a cleaning agent composed of a sulfuric acid-hydrogen peroxide mixture (SPM) and RCA Standard Clean I (SC1) containing ammonia and hydrogen peroxide to remove the remaining particles from the surface of the semiconductor substrate 60.

Alternatively, the present invention is able to utilize a cleaning agent containing ozone to perform an ex-situ cleaning process after the formation of the recesses 72, and according to the preferred embodiment of the present invention, the cleaning agent containing ozone includes RCA SC1, SPM, and deionized water containing ozone (DI-$O_3$).

In most cases, impurities such as carbon, fluoride, and hydrogen atoms will remain on the surface of the semiconductor substrate 60 and ultimately influence the formation of the epitaxial layer after performing the etching back process earlier for forming the spacer 70 and the anisotropic etching process for forming the recesses 72. By combining the in-situ oxygen flush with a cleaning agent or utilizing a cleaning agent containing ozone, the present invention is able to effectively remove the impurities or remaining atoms from the semiconductor substrate 60, and at the same time smoothens the surface of the recesses 72 to ensure the yield of the selective epitaxial growth process afterwards.

As shown in FIG. 6, a selective epitaxial growth process is performed after the cleaning process to form an epitaxial layer 74 within the recesses 72, in which the epitaxial layer 74 is served as the source/drain region of the strained-silicon PMOS transistor. Preferably, the epitaxial layer 74 is composed of silicon germanium ($Si_xGe_{1-x}$, in which $0<x<1$). Despite the fact that regular SiGe deposited into the predetermined source/drain region often increases the mobility of electron holes of PMOS, it will simultaneously decrease the electron mobility of NMOS and reduce the efficiency of the transistor. As a result, the strained-silicon MOS transistor fabricated according to the preferred embodiment of the present invention is a strained-silicon PMOS transistor.

Figure 7:
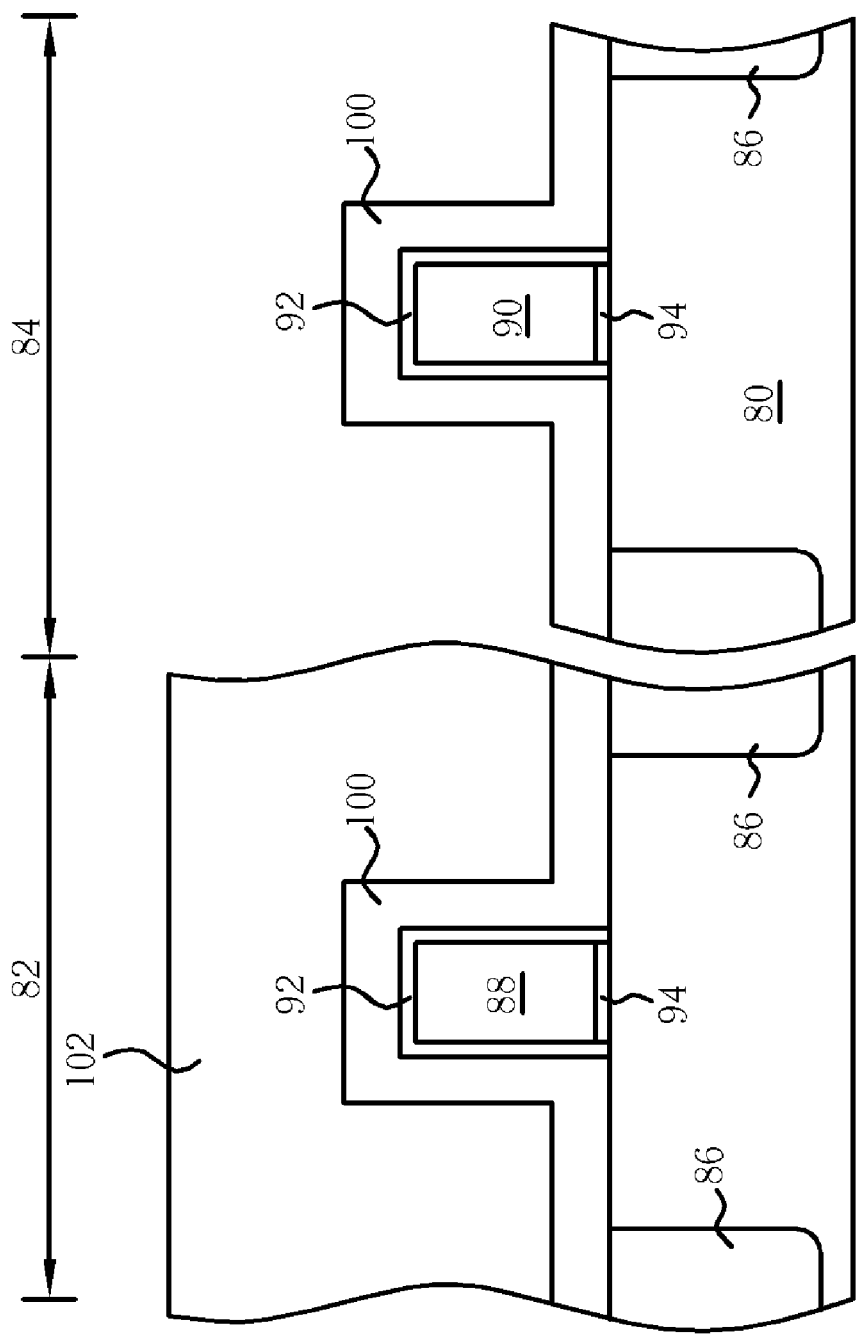
FIG. 7 through FIG. 10 are perspective diagrams showing the means of fabricating a strained-silicon CMOS transistor according to the present invention.

Please refer to FIG. 7 through FIG. 10. FIG. 7 through FIG. 10 are perspective diagrams showing the means of fabricating a strained-silicon CMOS transistor according to the present invention. As shown in FIG. 7, a shallow trench isolation (STI) 86 is formed to divide an NMOS area 82 and a PMOS area 84 within a semiconductor substrate 80, in which an NMOS gate 88 is formed on the NMOS area 82, a PMOS gate 90 is formed on the PMOS area 84, and a gate dielectric layer 94 is included between the NMOS gate 88, the PMOS gate 90, and the semiconductor substrate 80. Next, a cap layer 92 composed of silicon nitride and silicon oxide is formed over the top surface and sidewall of the NMOS gate 88 and the PMOS gate 90. Next, a chemical deposition process (CVD) is performed to form a sacrificial layer 100 composed of silicon oxide on the semiconductor substrate 80, the NMOS gate 88, and the PMOS gate 90. Next, a photoresist 102 is disposed on the NMOS gate 88 and covering the entire NMOS area 82. As described previously, since the SiGe deposited into the source/drain region during the selective epitaxial growth process will unavoidably decrease the mobility of electrons of NMOS, the photoresist 102 is formed on the NMOS gate 88 and semiconductor substrate 80 belonging to the NMOS area 82 to prevent the influence of SiGe on the NMOS.

Figure 8:
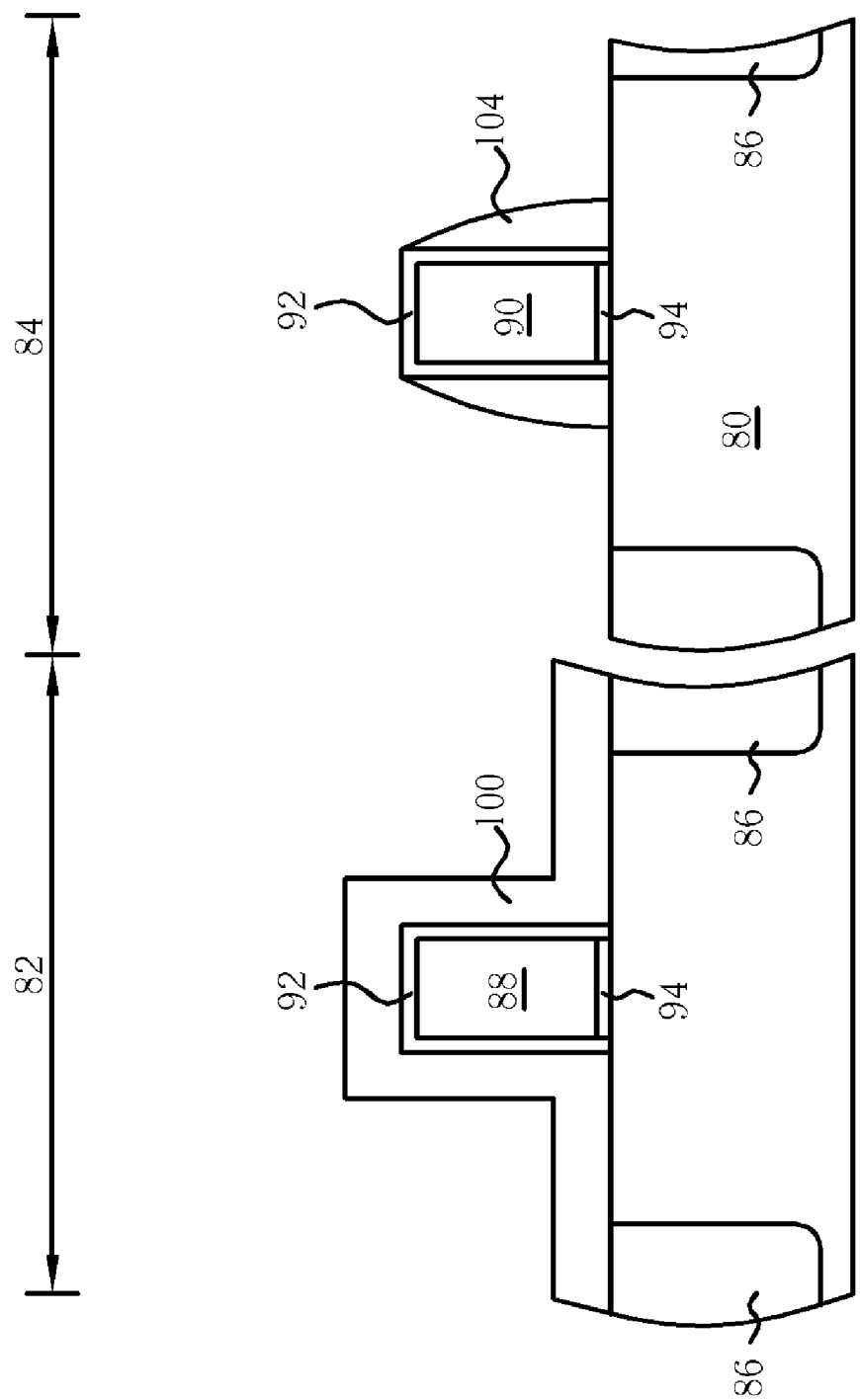

As shown in FIG. 8, an etching back process is performed to etch the sacrificial layer 100 to form a spacer 104 around the PMOS gate 90. Since the sacrificial layer 100 is protected by the photoresist 102 deposited earlier, no spacer will be formed around the NMOS gate 88 after the etching back process.

Figure 9:
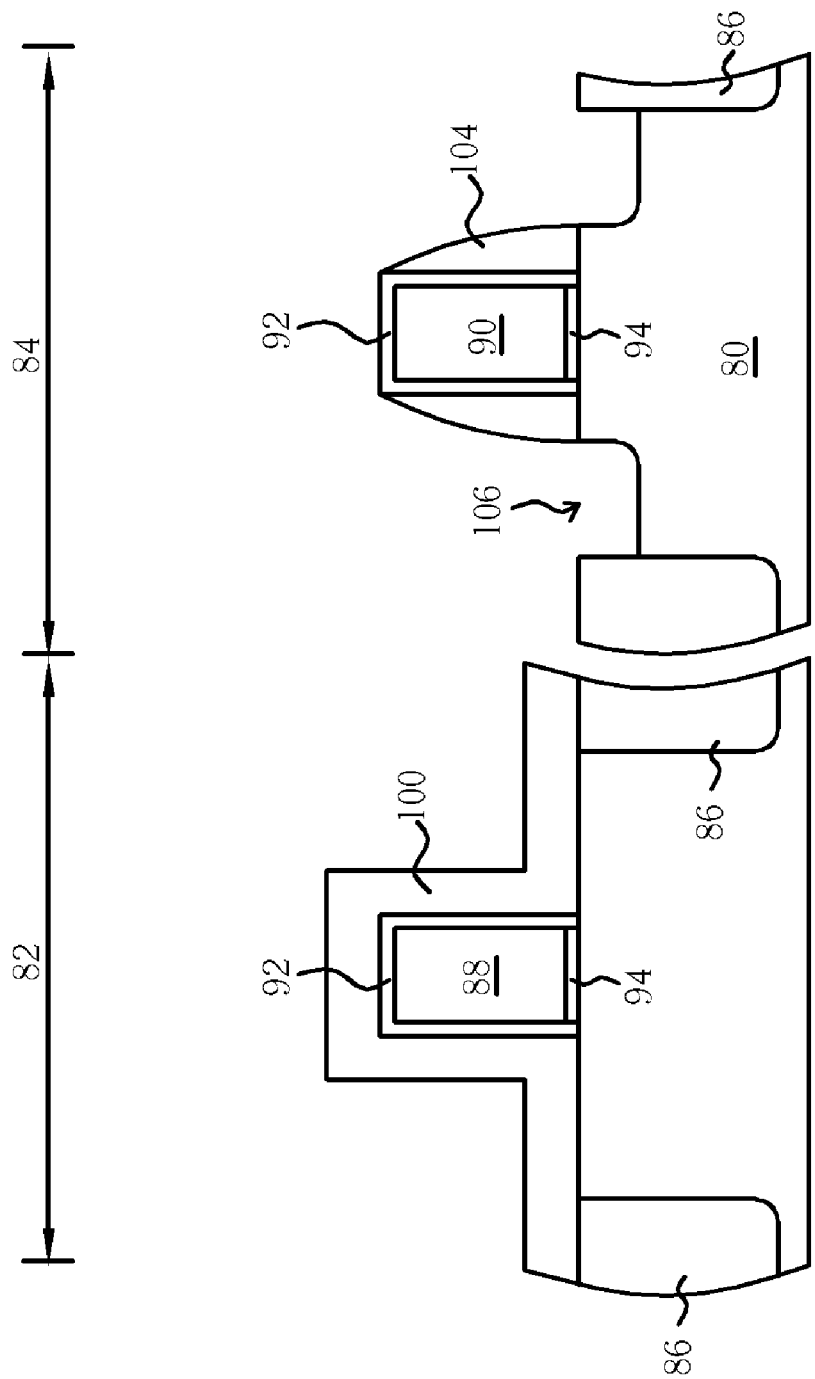

As shown in FIG. 9, an anisotropic etching process is performed by utilizing the sacrificial layer 100, the cap layer 92, the PMOS gate 90, and the spacer 104 as a mask to form two recesses 106 corresponding to two sides of the PMOS gate 90 and the spacer 104 in the semiconductor substrate 80, in which the depth of the recesses 106 is approximately 500 angstroms. As described previously, impurities such as carbon, fluoride, and hydrogen atoms will often remain on the surface of the semiconductor substrate 80 and ultimately influence the formation of the epitaxial layer after performing the etching back process earlier for forming the spacer 104 and the anisotropic etching process in particular for forming the recesses 106. Hence, an in-situ oxygen flush is performed after the anisotropic etching process on the semiconductor substrate 80 within the process chamber of the anisotropic etching process. After the semiconductor substrate 80 is moved outside the process chamber, a cleaning process is performed by utilizing a cleaning agent composed of sulfuric acid-hydrogen peroxide mixture (SPM) and RCA Standard Clean I (SC1) containing ammonia and hydrogen peroxide to remove the remaining particles from the surface of the semiconductor substrate 80.

Alternatively, the present invention is able to utilize a cleaning agent containing ozone to perform an ex-situ cleaning process on the semiconductor substrate 80 after the formation of the recesses 106 and removing the semiconductor substrate 80 from the etching chamber, in which the cleaning agent containing ozone includes RCA SC1, SPM, and deionized water containing ozone (DI-$O_3$).

Figure 10:
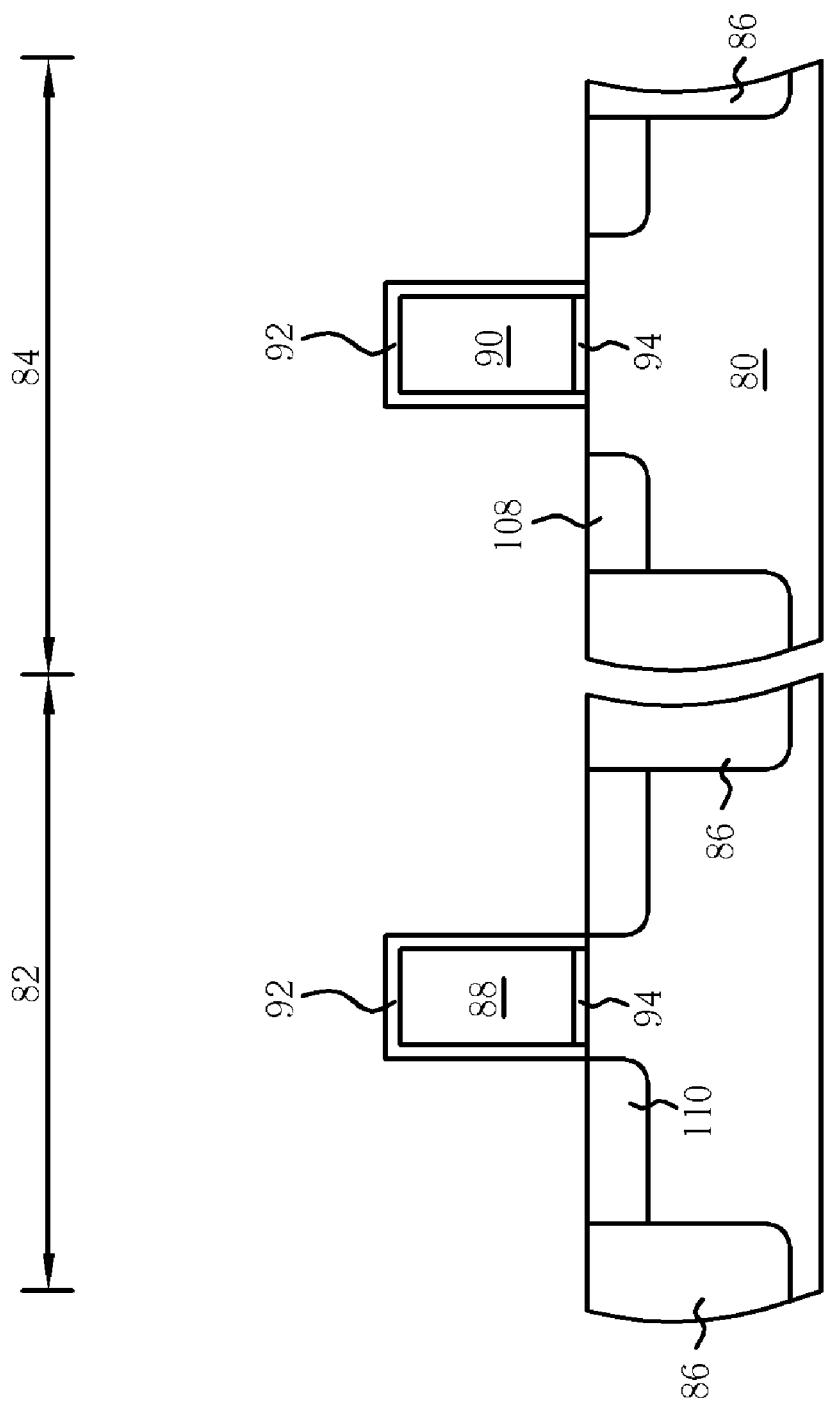

As shown in FIG. 10, a selective epitaxial growth process is performed after the cleaning process to form an epitaxial layer 108 within the recesses 106, in which the epitaxial layer 108 is served as the source/drain region of the strained-silicon PMOS transistor. After removing the sacrificial layer 100 and the spacer 104 from the NMOS gate 88 and the PMOS gate 90, an ion implantation process is performed by utilizing a mask to cover the PMOS region 84 and form a source/drain region 110 of the NMOS transistor.

In contrast to the conventional method of fabricating MOS transistors, the present invention combines an in-situ oxygen flush after the formation of the predetermined source/drain region of the strained-silicon MOS transistor with a wet cleaning agent, or utilizes a cleaning agent containing ozone to remove the impurities or remaining atoms from the semiconductor substrate 80, and at the same time smoothens the surface of the recesses 106 to ensure the yield of the selective epitaxial growth process afterwards.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating strained-silicon transistors comprising:
    providing a semiconductor substrate, wherein the semiconductor substrate comprises a gate structure thereon;
    performing an etching process to form two recesses corresponding to the gate structure within the semiconductor substrate;
    performing an oxygen flush on the semiconductor substrate;
    utilizing a cleaning agent to perform a cleaning process on the semiconductor substrate, wherein the cleaning agent comprises sulfuric acid-hydrogen peroxide mixture (SPM) and RCA-1 for removing the remaining particles on the surface of the semiconductor substrate; and
    performing a selective epitaxial growth (SEG) to form an epitaxial layer in each recess for forming a source/drain region.

2. The method of claim 1, wherein gate structure further comprises:
    a gate dielectric layer;
    a gate disposed on the gate dielectric layer;
    a cap layer formed on the gate; and
    an oxide-nitride-oxide (ONO) offset spacer.

3. The method of claim 1, wherein the oxygen flush is an in-situ process performed in the process chamber of the etching process.

4. The method of claim 1, wherein the epitaxial layer comprises silicon germanium ($Si_xGe_{1-x}$, wherein 0<x<1).

5. The method of claim 1, wherein the strained-silicon transistors comprises PMOS transistors.

6. A method of fabricating strained-silicon transistors comprising:
    providing a semiconductor substrate, wherein the semiconductor substrate comprises a gate structure thereon;
    performing an etching process to form two recesses corresponding to the gate structure within the semiconductor substrate;
    utilizing a cleaning agent containing ozone to perform a cleaning process for removing the remaining etching particles from the surface of the semiconductor substrate, wherein the cleaning agent containing ozone comprises RCA-1, SPM, and deionized water containing ozone; and
    performing a selective epitaxial growth (SEG) to form an epitaxial layer in each recess for forming a source/drain region.

7. The method of claim 6, wherein gate structure further comprises:
    a gate dielectric layer;
    a gate disposed on the gate dielectric layer;
    a cap layer formed on the gate; and
    an oxide-nitride-oxide (ONO) offset spacer.

8. The method of claim 6, wherein the cleaning process is an ex-situ process.

9. The method of claim 6, wherein the epitaxial layer comprises silicon germanium ($Si_xGe_{1-x}$, wherein 0<x<1).

10. The method of claim 6, wherein the strained-silicon transistors comprises PMOS transistors.

11. A method of fabricating strained-silicon CMOS transistors comprising:
    providing a semiconductor substrate, wherein the semiconductor substrate comprises an NMOS region and a PMOS region, and the NMOS region and the PMOS region further comprise an NMOS gate and a PMOS gate separately;
    forming a sacrificial layer over the surface of the NMOS gate and the PMOS gate;
    performing a first etching process to etch part of the sacrificial layer for forming a spacer around the PMOS gate;
    performing a second etching process by utilizing the sacrificial layer, the PMOS gate and the spacer as a mask to form two recesses corresponding to the PMOS gate in the semiconductor substrate;
    performing an oxygen flush on the semiconductor substrate;
    performing a cleaning process on the semiconductor substrate;
    performing a selective epitaxial growth (SEG) to form an epitaxial layer in each recess for forming a source/drain region of the PMOS transistor;
    removing the sacrificial layer and the spacer; and
    forming a source/drain region of the NMOS transistor.

12. The method of claim 11, wherein the NMOS gate, the PMOS gate, and the semiconductor substrate comprises a gate dielectric layer in between and the surface of the NMOS gate and the PMOS gate comprises a cap layer.

13. The method of claim 12, wherein the cap layer comprises silicon dioxide and silicon nitride, and the sacrificial layer comprises silicon oxide.

14. The method of claim 11, wherein the oxygen flush is an in-situ process performed in the process chamber of the second etching process.

15. The method of claim 11, wherein the cleaning agent of the cleaning process comprises sulfuric acid-hydrogen peroxide mixture (SPM) and RCA-1 for removing the remaining particles on the surface of the semiconductor substrate.

16. The method of claim 11, wherein the epitaxial layer comprises silicon germanium ($Si_xGe_{1-x}$, wherein 0<x<1).

17. The method of claim 11 further comprising:
forming a photoresist on the NMOS region before the first etching process.

18. The method of claim 11, wherein the process of forming the source/drain of the NMOS transistor comprises an ion implantation process.

19. A method of fabricating strained-silicon CMOS transistors comprising:
providing a semiconductor substrate, wherein the semiconductor substrate comprises an NMOS region and a PMOS region, and the NMOS region and the PMOS region further comprise an NMOS gate and a PMOS gate separately;
forming a sacrificial layer over the surface of the NMOS gate and the PMOS gate;
performing a first etching process to etch part of the sacrificial layer for forming a spacer around the PMOS gate;
performing a second etching process by utilizing the sacrificial layer, the PMOS gate and the spacer as a mask to form two recesses corresponding to the PMOS gate in the semiconductor substrate;
utilizing a cleaning agent containing ozone to perform a cleaning process on the semiconductor substrate for removing the remaining particles on the surface of the semiconductor substrate;
performing a selective epitaxial growth (SEG) to form an epitaxial layer in each recess for forming a source/drain region of the PMOS transistor;
removing the sacrificial layer and the spacer; and
forming a source/drain region of the NMOS transistor.

20. The method of claim 19, wherein the NMOS gate, the PMOS gate, and the semiconductor substrate comprises a gate dielectric layer in between and the surface of the NMOS gate and the PMOS gate comprises a cap layer.

21. The method of claim 19, wherein the cap layer comprises silicon dioxide and silicon nitride, and the sacrificial layer comprises silicon oxide.

22. The method of claim 19, wherein the cleaning agent containing ozone further comprises sulfuric acid-hydrogen peroxide mixture (SPM), RCA-1, and deionized water containing ozone.

23. The method of claim 19, wherein the epitaxial layer comprises silicon germanium ($Si_xGe_{1-x}$, wherein 0<x<1).

24. The method of claim 19, further comprising:
forming a photoresist on the NMOS region before the first etching process.

25. The method of claim 19, wherein the process of forming the source/drain of the NMOS transistor comprises an ion implantation process.

* * * * *